(12) United States Patent
Sakurada

(10) Patent No.: US 8,394,677 B2
(45) Date of Patent: Mar. 12, 2013

(54) METHOD OF FABRICATING SEMICONDUCTOR DEVICE

(75) Inventor: Shinichi Sakurada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 102 days.

(21) Appl. No.: 13/036,425

(22) Filed: Feb. 28, 2011

(65) Prior Publication Data

US 2011/0217826 A1 Sep. 8, 2011

(30) Foreign Application Priority Data

Mar. 3, 2010 (JP) ................................. 2010-046665

(51) Int. Cl.
*H01L 21/00* (2006.01)
(52) U.S. Cl. .......................... 438/113; 438/118; 438/464
(58) Field of Classification Search .......................... None
See application file for complete search history.

(56) References Cited

U.S. PATENT DOCUMENTS

2006/0051935 A1* 3/2006 Silverbrook .................. 438/458

FOREIGN PATENT DOCUMENTS

| JP | 4-69949 A | 3/1992 |
| JP | 2004-207607 A | 7/2004 |

* cited by examiner

*Primary Examiner* — Scott B Geyer
(74) *Attorney, Agent, or Firm* — Foley & Lardner LLP

(57) ABSTRACT

A method of fabricating a semiconductor device according to one embodiment includes preparing a wafer having a plurality of chip areas, each chip area to become semiconductor chip, bonding the first side of the wafer to a support substrate through a removable adhesive, dividing the wafer into individually separate semiconductor chips, applying adhesive tape to the second side of the separate semiconductor chips, the second side being opposite to the first side bonded to the support substrate, and the adhesive tape being softer than the support substrate, removing the support substrate from the semiconductor chips, and picking up the separate semiconductor chips that are on the adhesive tape.

20 Claims, 9 Drawing Sheets

METHOD OF FABRICATING SEMICONDUCTOR DEVICE

This application is based upon and claims the benefit of priority from Japanese patent application No. 2010-046665, filed on Mar. 3, 2010, the disclosure of which is incorporated herein in its entirety by reference.

BACKGROUND OF THE INVENTION

1. Field of the Invention

The present invention relates to a method of fabricating semiconductor devices by dicing wafers.

2. Description of Related Art

Semiconductor devices are fabricated in such a way that wafers are thinned and the thinned wafers are diced, for example. JP2004-207607A discloses a wafer dividing method in which a wafer having a plurality of circuits formed on the front side is divided into separate semiconductor chips with circuits. This dividing method includes the steps of attaching the front side of a wafer to a support substrate through an adhesive, polishing the back side of the wafer, cutting the wafer from the back side to dice the wafer into separate semiconductor chips, and picking up the semiconductor chips from the support substrate. In addition, it is described that the support substrate is formed of a highly rigid member.

It is difficult to pick up thinned semiconductor chips held on a support substrate from the support substrate formed of a highly rigid member, by using the method described in JP2004-207607A. For example, it is likely that thinned, fragile semiconductor chips will be chipped or cracked in picking up the semiconductor chips based upon this method.

Also, there is a method in which the back side of a wafer is processed according to which protection tape is applied on the front side of the wafer, i.e., the surface on which circuits, electrodes, or the like are formed. In this process, dicing tape is applied on the back side of the wafer. After the process for the wafer, the protection tape on the front side of the wafer is removed, and then the wafer is diced. However, because thinned wafers have a low rigidity and tend to warp, it is difficult to perfectly apply dicing tape on wafers. For this reason, a space, i.e., a void is sometimes created between the wafer and dicing tape. When water that is used for washing and that contains cutting dusts enters this void, it is likely that the cutting dusts will become attached to circuits or electrodes on the front side of the wafer.

Therefore, it is desirable to provide an improved method of fabricating a semiconductor device.

SUMMARY

In one embodiment, a method of fabricating a semiconductor device includes preparing a wafer having a plurality of chip areas, each chip area to become semiconductor chip, bonding a first side of the wafer to a support substrate through a removable adhesive, dividing the wafer into individually separate semiconductor chips, applying adhesive tape to a second side of the separate semiconductor chips, the second side being opposite to the first side bonded to the support substrate, and the adhesive tape being softer than the support substrate, removing the support substrate from the semiconductor chips, and picking up the separate semiconductor chips on the adhesive tape.

According to the foregoing fabrication method, the semiconductor chips bonded to soft adhesive tape are picked up, so that it is made possible to readily pick up the semiconductor chips. In addition, dicing grooves formed when dividing the wafer provide clearance for sags of this soft adhesive tape, so that it is made possible to perfectly apply the adhesive tape to the wafer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following, a method of fabricating a semiconductor device having through-hole interconnections will be described as an example. However, it is possible to generally adapt the present invention to methods of fabricating semiconductor devices by dicing wafers.

FIGS. 1A to 1D are process drawings of a method of fabricating a semiconductor device according to a first embodiment. In this embodiment, first, wafer 10 including a plurality of chip areas 14 to be semiconductor chips is prepared (see FIG. 1A). For example, predetermined circuits, electrode pads, or the like are formed on the front side of a disc-shaped substrate made of silicon through processes such as diffusion, and then wafer 10 is obtained. This disc-shaped substrate is obtained in such a way that an ingot formed by single crystal pulling or the like is sliced. Dicing line 16 is formed along each of the boundaries between individual chip areas 14.

Figure 1A:
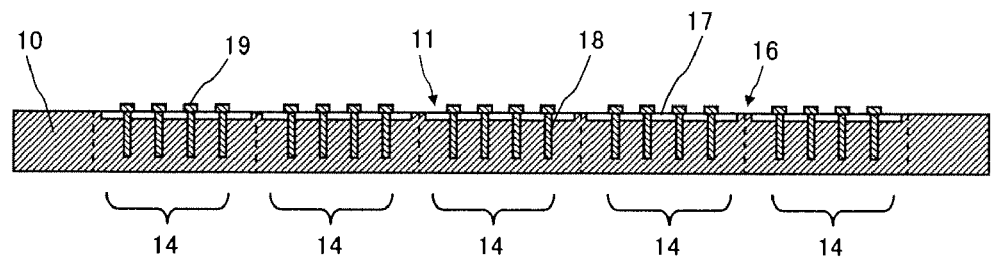
FIGS. 1A to 1D are process drawings depicting the fabrication processes of semiconductor devices according to an embodiment.

As shown in FIG. 1A, each chip area 14 on first side 11 of wafer 10 is formed with predetermined circuit 17 like a memory circuit, a plurality of surface electrodes 19, and conductors 18 individually electrically connected to surface electrodes 19. Conductors 18 are extended into wafer 10 at a predetermined depth. It is possible that surface electrode 19 is a bump electrode formed on an electrode pad, not shown, on wafer 10. It is possible that above-mentioned processes are applied to first side 11 of wafer 10 but other processing are applied to wafer 10.

Figure 1B:
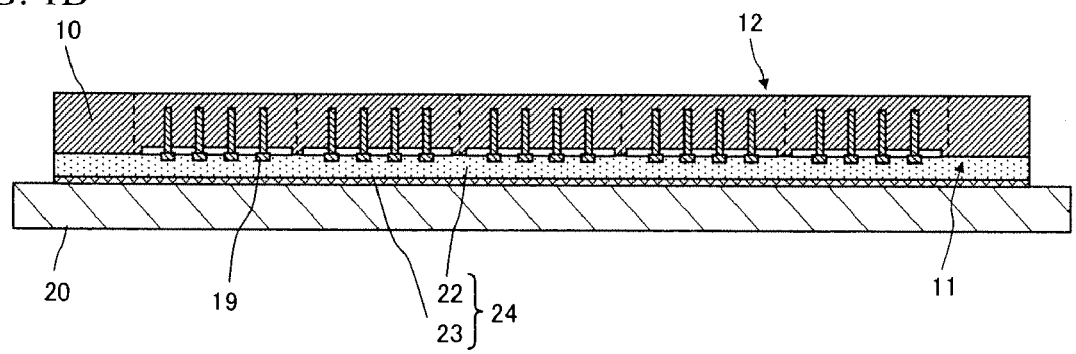

Subsequently, as shown in FIG. 1B, first side 11 of wafer 10 is bonded to support substrate 20 through removable adhesive 24. It is possible that adhesive 24 is one that has a sufficiently strong adhesion between wafer 10 and support substrate 20 and is removable later.

Support substrate 20 has such rigidity that can stably support wafer 10. In particular, support substrate 20 preferably has such a high rigidity that can prevent the chipping or cracking of the wafer in processing operations including the processing operations of grinding and cutting the wafer, described later. For this support substrate 20, it is possible to use a glass substrate.

In this embodiment, for a preferable example of removable adhesives, two-layer adhesive 24 formed of first adhesive layer 22 and second adhesive layer 23 is used. First adhesive layer 22 covers first side 11 of wafer 10, and, in particular, cover bumps 19, which are the surface electrodes formed on first side 11. It is possible that first adhesive layer 22 is made of any adhesive that can protect first side 11 of wafer 10, and surface electrodes 19, in particular. It is possible that first adhesive layer 22 is an ultraviolet light-curable acrylic adhesive, for example. In the case in which the height of surface electrode 19 is about 20 μm, it is possible that first adhesive layer 22 has a thickness of about 50 μm.

Second adhesive layer 23 is in contact with support substrate 20. Preferably, second adhesive layer 23 is one that reduces the adhesion force by applying specific energy. For an adhesive layer like this, such adhesives that weaken the adhesion force by applying heat or light are possible. Alternatively, it is possible that second adhesive layer 23 can be materials that are vaporized by applying laser light, like 3M™ LTHC (Light-To-Heat Conversion) Coating, made by Sumitomo 3M Limited.

Using adhesive 24 formed of these two adhesive layers 22 and 23 allows wafer 10 to be supported on support substrate 20 without damaging surface electrodes 19, even if surface electrodes 19 are projected on first side 11 of wafer 10.

Figure 1C:
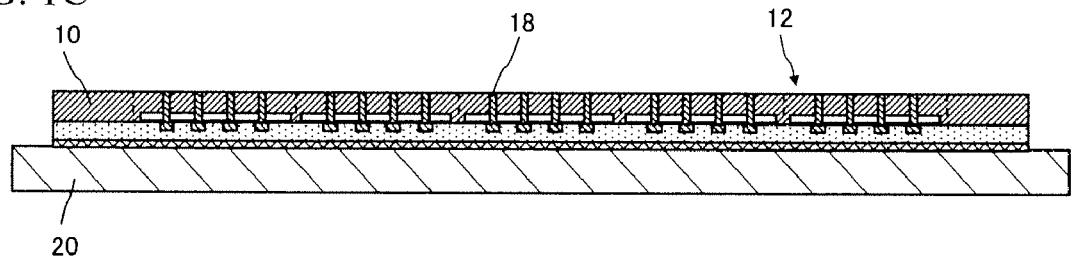

Subsequently, as shown in FIG. 1C, second side 12 opposite to first side 11 of wafer 10 is ground until wafer 10 has a predetermined thickness. Preferably, conductors 18 are exposed on second side 12 of wafer 10.

Wafer 10 is thinned to have a predetermined thickness, such as 50 μm, as wafer 10 is bonded to support substrate 20, and conductors 18 are exposed from second side 12 of wafer 10. Because thinned wafer 10 is bonded to support substrate 20 having a high rigidity, damaging wafer 10 is eliminated in this processing operation and the subsequent processing operations, and carrying or handling wafer 10 is facilitated.

Figure 1D:
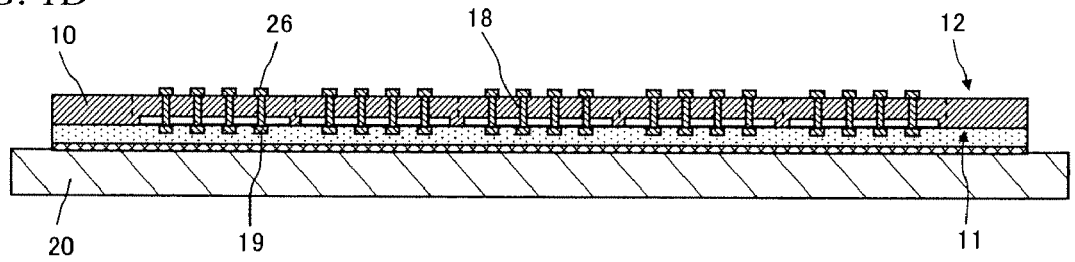

Subsequently, as shown in FIG. 1D, bumps 26 are formed, which are back electrodes electrically connected to conductors 18 exposed in second side 12 of wafer 10. As described above, surface electrodes 19 and back electrodes 26 are formed at the conductors that penetrate through wafer 10, i.e., through-hole interconnections 18.

In this embodiment, because wafer 10 is ground when wafer 10 is fixed on support substrate 20 having a high rigidity, wafer 10 is prevented from being chipped or cracked, which is caused by an external force when wafer 10 being ground. In addition, in the case in which there is no need to reduce the thickness of wafer 10, the processing operation of grinding second side 12 of wafer 10 is omitted.

Figure 2A:
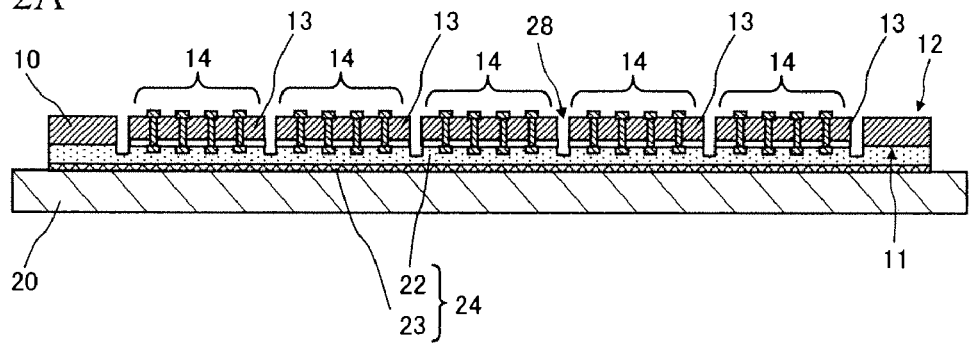
FIGS. 2A to 2E are process drawings depicting the fabrication processes of the semiconductor devices, subsequent to the processes shown in FIGS. 1A to 1D.
Figure 3:
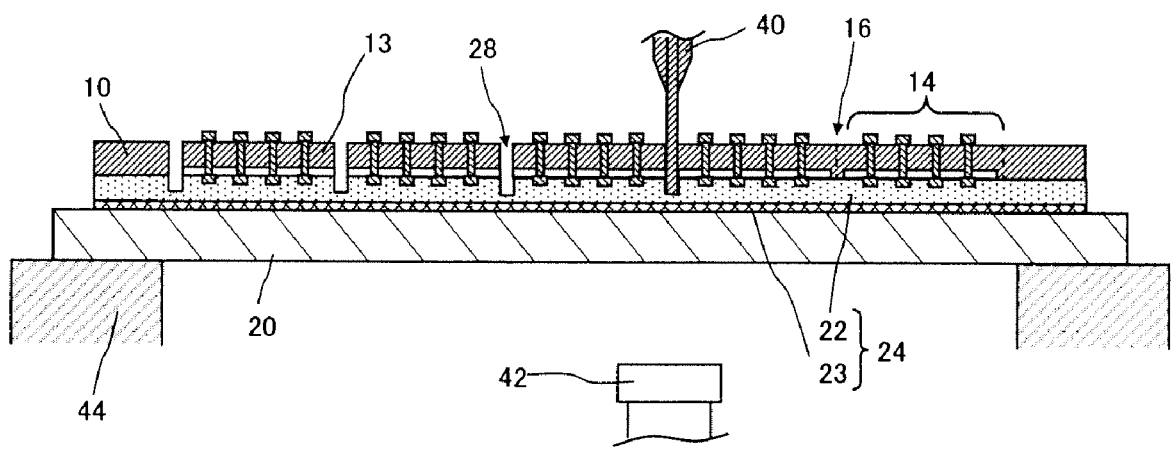
FIG. 3 is a diagram depicting a specific exemplary process of cutting a wafer.

Subsequently, wafer 10 is divided into individually separate semiconductor chips 13 (see FIG. 2A). More specifically, as shown in FIG. 3, support substrate 20 bonded to wafer 10 is held on stage 44 disposed on a dicing device, not shown.

In the case in which support substrate 20 is a transparent substrate, e.g., a glass substrate, it is possible to recognize dicing lines 16 formed on wafer 10 through transparent support substrate 20 by any detection device 42 which is disposed in the lower part of stage 44. For the detection device 42, a camera can be used. In this manner, generally, it is possible that wafer 10 is cut along dicing lines 16 formed on first side 11 of wafer 10 while dicing lines 16 are being detected.

Wafer 10 is cut by dicing blade 40, for example, which is rotated at high speed. Dicing blade 40 forms the groove 28 that have the depth from second surface 12 of the wafer to adhesive 24. More specifically, preferably, dicing blade 40 is adjusted in such a way that dicing blade 40 is brought from second side 12 of wafer 10 to a middle part of second adhesive layer 23. With this adjustment, wafer 10 is divided into each separate chip area 14, i.e., semiconductor chip 13. At this time, because separate semiconductor chips 13 are bonded to support substrate 20, diced semiconductor chips 13 are not scattered. Consequently, an integrated part of semiconductor chips 13 and support substrate 20 is formed with dicing grooves 28.

Wafer 10 is diced as wafer 10 is bonded to support substrate 20 having a high rigidity. Therefore, the deformation of semiconductor chips 13, which occurs in dicing wafer 10, is reduced as compared with the case in which a wafer is diced as the wafer is bonded to soft dicing tape. Consequently, according to the fabrication method of this embodiment, micro defects that are produced in semiconductor chips 13 when dicing wafer 10, i.e., the occurrences of chipping, are eliminated.

Furthermore, in the case in which a wafer is diced as the wafer is bonded to soft dicing tape, soft dicing tape is also partially cut, so that fiber-like cutting dusts, i.e., burr of whisker shape, are sometimes remain in dicing grooves. When these cutting dusts remain on semiconductor chips and are attached to circuits or electrodes on the front sides of the semiconductor chips, it is likely to deteriorate the performance of the semiconductor chips. In this embodiment, wafer 10 is diced on support substrate 20 having rigidity higher than the rigidity of a tape member like dicing tape typically used, so that producing these cutting dusts is eliminated.

In addition, preferably, wafer 10 is diced while being cleaned with pure water. This is in order not to leave cutting dusts on wafer 10.

Figure 2B:
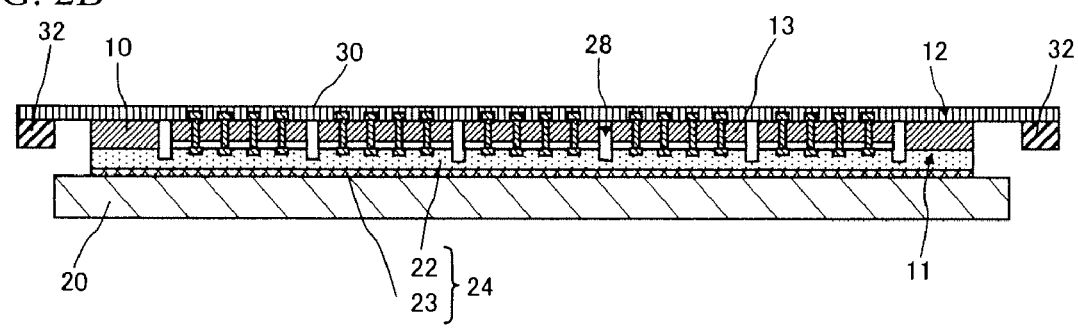

Subsequently, as shown in FIG. 2B, adhesive tape 30 that is softer at least than support substrate 20 is applied to second sides 12 of separate semiconductor chips 13, second sides 12 being opposite to first sides 11 that are bonded to support substrate 20. For this adhesive tape 30, it is possible to use durable tape, such as dicing tape generally used. Preferably, dicing tape is one such that the adhesion is reduced by applying ultraviolet light, for example.

Adhesive tape 30 is applied to frame-shaped jig 32 in tension, and second sides 12 of wafer 10, which is diced into separate semiconductor chips 13, are bonded to adhesive tape 30 inside this frame-shaped jig 32.

In this embodiment, because adhesive tape 30 is applied to second sides 12 of wafer 10 formed with dicing grooves 28 after cutting wafer 10, dicing grooves 28 provide clearance for a sag of adhesive tape 30. Consequently, voids between adhesive tape 30 and semiconductor chips 13 is suppressed.

As described above, it is made possible to perfectly apply adhesive tape 30 to wafer 10. Moreover, in the case of cleaning second side 12 of wafer 10 during dicing, the possibility that these will be residual foreign substances between adhesive tape 30 and semiconductor chips 13 is also reduced.

Figure 2C:
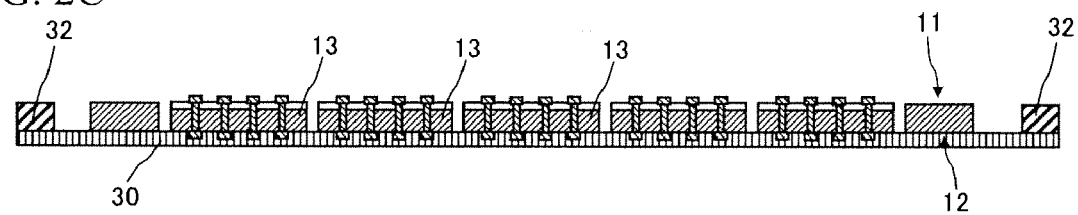
Figure 4A:
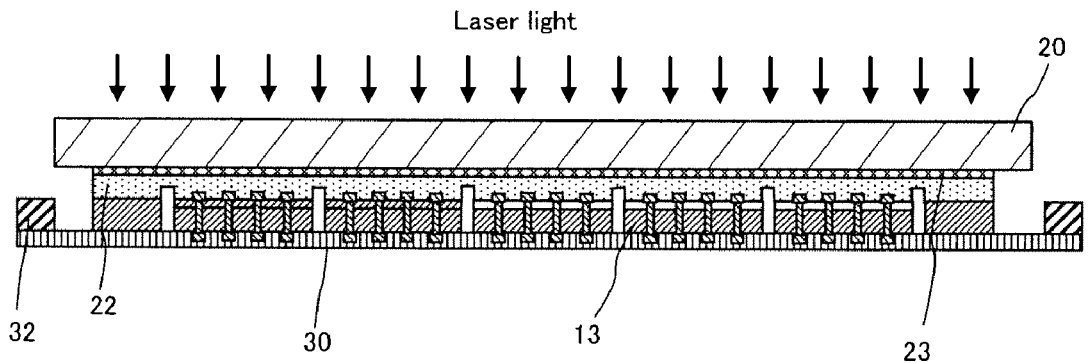
FIGS. 4A to 4C are process drawings depicting the processes of removing a support substrate from semiconductor chips.
Figure 4B:
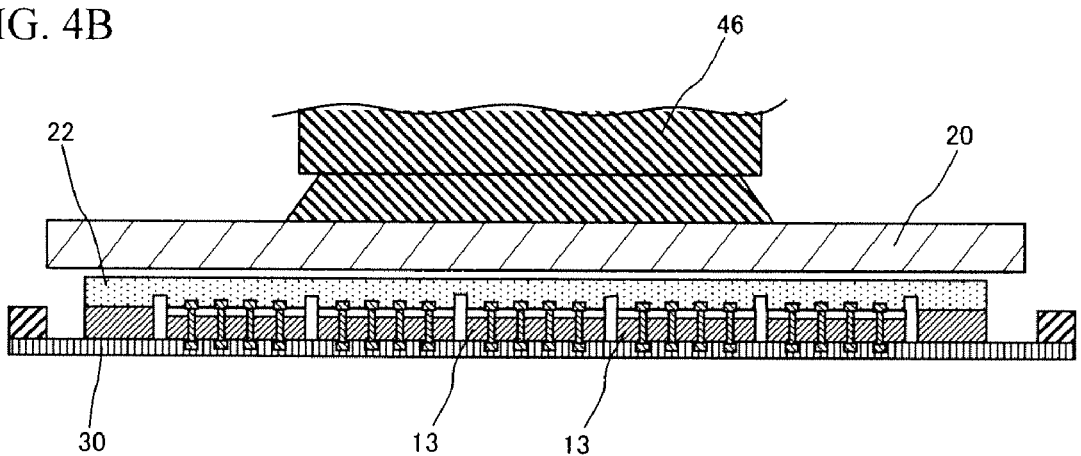

Subsequently, support substrate 20 is removed from semiconductor chips 13 (see FIG. 2C). More specifically, in the case in which adhesive 24 that bonds semiconductor chips 13 to support substrate 20 is formed of the two adhesive layers as described above, support substrate 20 is removed from semiconductor chips 13 while specific energy such as light or heat is being applied to second adhesive layer 23. In the case in which second adhesive layer 23 is vaporized by applying laser light, as shown in FIG. 4A, laser light is applied onto second adhesive layer 23 for vaporizing second adhesive layer 23, and thus it is possible to remove support substrate 20 from semiconductor chip 13. For removing support substrate 20 from semiconductor chip 13, as shown in FIG. 4B, it is possible to use vacuum collet 46 that vacuum-sucks support substrate 20, for example.

Figure 4C:
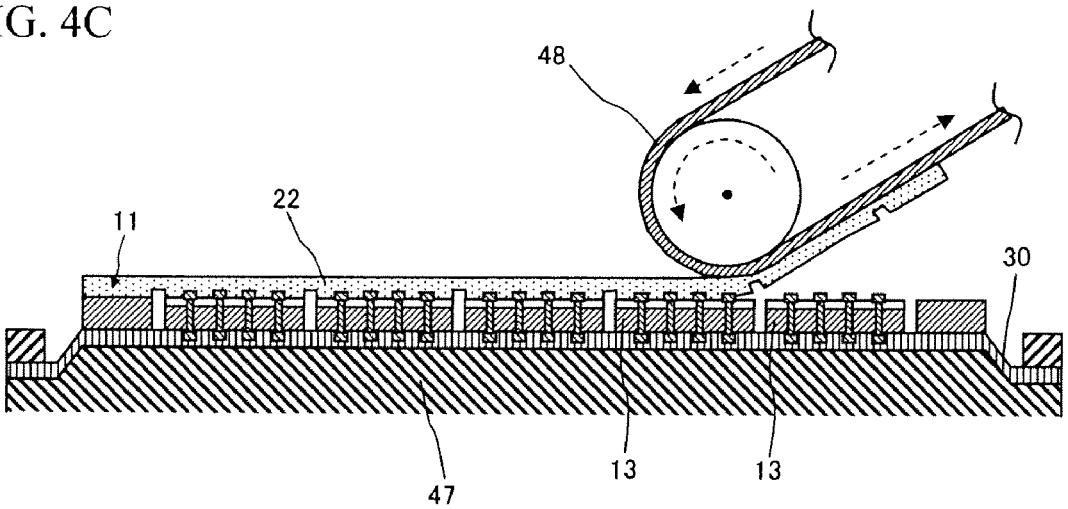

Subsequently, as shown in FIG. 4C, adhesive tape 30 applied to semiconductor chips 13 is placed on stage 47 having a projected shape, and adhesive tape 30 is stretched. Another adhesive member 48 is applied to first adhesive layer 22 in this state, and adhesive member 48 is removed. Consequently, it is possible to transfer first adhesive layer 22 remaining on first sides 11 of semiconductor chips 13 to adhesive member 48. Preferably, the adhesion between this adhesive member 48 and first adhesive layer 22 is greater than the adhesion between semiconductor chips 13 and first adhesive layer 22. As a result of this, it is made possible to excellently remove first adhesive layer 22 from first side 11 of wafer 10. In this manner, as shown in FIG. 2C, semiconductor chips 13, which are diced and separated, are bonded on adhesive tape 30.

Figure 2D:
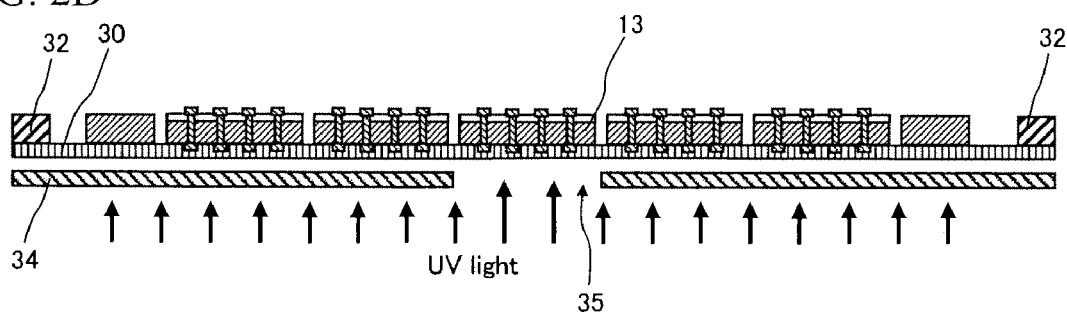

Subsequently, semiconductor chips 13 on adhesive tape 30 are picked up. More specifically, ultraviolet light is locally applied onto a predetermined semiconductor chip 13 on adhesive tape 30 to reduce the adhesion of adhesive tape 30 in the portion that comes into contact with this semiconductor chip 13. For example, as shown in FIG. 2D, ultraviolet light is applied onto adhesive tape 30 through mask 34 having opening 35 corresponding to the area of a single semiconductor chip. Consequently, the adhesion of adhesive tape 30 that comes into contact with semiconductor chip 13 corresponding to the position of opening 35 of mask 34 is reduced.

As described above, the adhesion of adhesive tape 30 is reduced only at the portion that comes into contact with the semiconductor chip to be picked up, so that the enough adhesion of other semiconductor chips is maintained. As a result, when a predetermined semiconductor chip is picked up, the removal of other semiconductor chips or movement of other semiconductor chips is prevented.

Figure 2E:
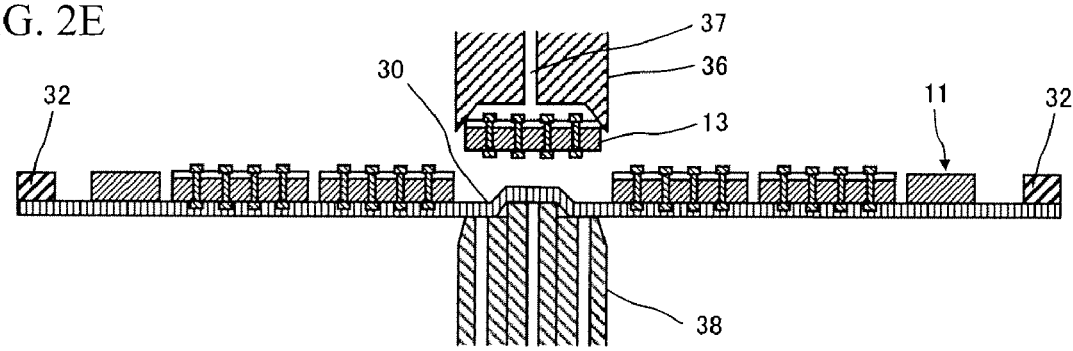

As shown in FIG. 2E, semiconductor chip 13 in the area in which adhesion is reduced is then picked up. Because of soft adhesive tape 30, adhesive tape 30 is bent and adhesive tape 30 is peeled from the end part of semiconductor chip 13 when semiconductor chip 13 is picked up. Consequently, semiconductor chip 13 is readily picked up.

Preferably, semiconductor chip 13 is picked up while being plunged up with plunge-up mechanism 38, for example, is picked up from one side of adhesive tape 30, the side of which is the reverse side of the side having semiconductor chips 13 bonded. It is possible to use vacuum collet 36 having vacuum hole 37 for vacuum-sucking semiconductor chip 13 in order to pick up semiconductor chip 13.

Preferably, plunge-up mechanism 38 plunges up adhesive tape 30 in a convex-shape with multiple steps as plunge-up mechanism 38 sucks adhesive tape 30. Consequently, adhesive tape 30 is gradually peeled off from the end part of semiconductor chip 13. As a result, for even thin semiconductor chips, semiconductor chip 13 can be prevented from being damaged and semiconductor chip 13 is readily picked up. Preferably, adhesive tape 30 has such flexibility so that can endure plunging up like this.

Through the processing operations as discussed above, semiconductor devices are fabricated by picking up a plurality of semiconductor chips 13.

Figure 5A:
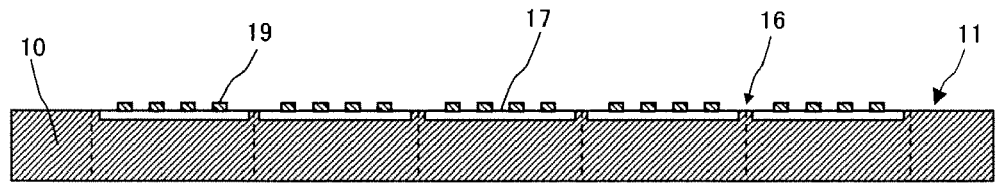
FIGS. 5A to 5D are process drawings depicting an exemplary method of fabricating a semiconductor device having through-hole interconnections.

In FIGS. 1A to 1D, an example is shown in which the wafer is ground after conductors 18 are formed on wafer 10, and FIGS. 5A to 5D show another method of fabricating a semiconductor device having through-hole interconnections. As shown in FIG. 5A, first, wafer 10 having almost the same configuration as that of wafer 10 shown in FIG. 1A is prepared. However, in this embodiment, predetermined circuit 17 and a plurality of surface electrodes 19 are formed in each of a plurality of chip areas of wafer 10, but conductor 18 electrically connected to surface electrode 19 is not formed (see FIG. 1A).

Figure 5B:
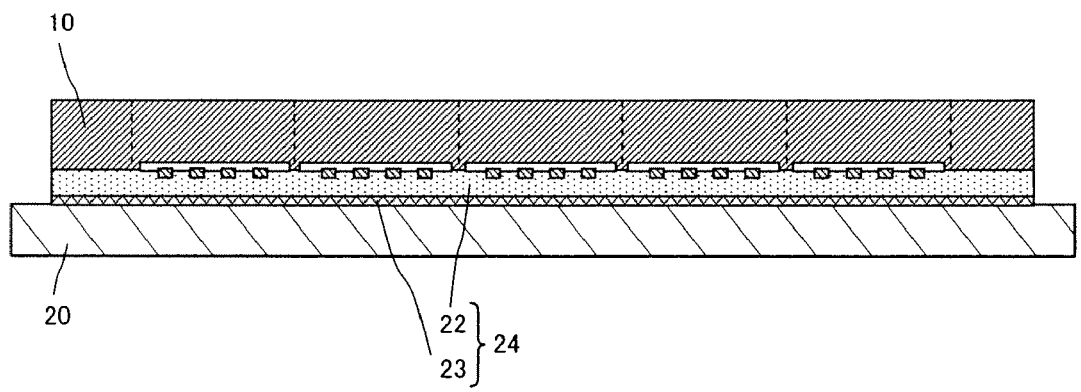
Figure 5C:
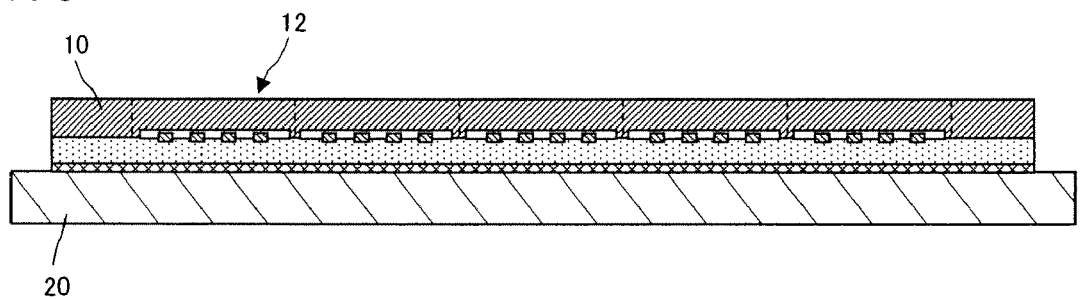

Subsequently, as shown in FIG. 5B, first side 11 of wafer 10 is bonded to support substrate 20 through removable adhesive 24. Preferably, adhesive 24 is formed of two adhesive layers 22 and 23 described above. Next, as shown in FIG. 5C, second side 12 of wafer 10 is ground to thin wafer 10.

Figure 5D:
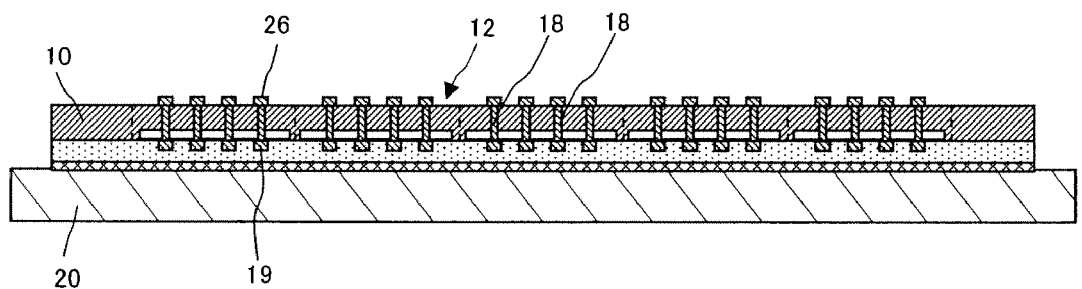

Subsequently, as shown in FIG. 5D, holes are formed in wafer 10 from second side 12 of wafer 10, and conductors, i.e., through-hole interconnections 18 are formed in the holes. The hole reaches surface electrode 19, and conductor 18 is electrically connected to surface electrode 19. Back electrodes 26 electrically connected to conductors 18 are then formed on second side 12 of wafer 10. Next, as described above, a plurality of semiconductor chips are formed through the processing operations shown in FIGS. 2A to 2E.

In the following, an exemplary method of fabricating a Chip on Chip (COC) semiconductor device using semiconductor chips 13 described above will be described. Semiconductor chips having through-hole interconnections are also taken as an example for explanation below.

Figure 6A:
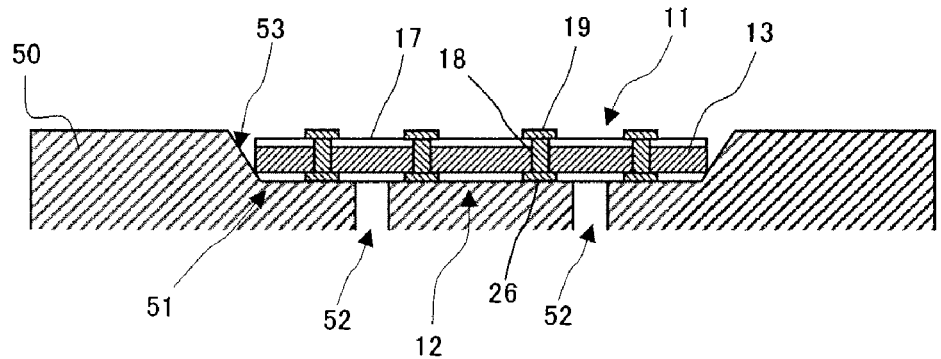
FIGS. 6A to 6C are process drawings depicting exemplary processes of fabricating a Chip on Chip semiconductor device.

As shown in FIG. 6A, semiconductor chip 13 is placed on vacuum chuck stage 50 as first side 11 that has been formed with circuit 17 and surface electrodes 19 is faced up. Vacuum chuck stage 50 is formed with recess 51, and semiconductor chip 13 is accommodated in this recess 51.

Semiconductor chip 13 has predetermined circuit 17, e.g., a memory circuit, on first side 11 of a substrate of a nearly rectangular plate made of silicon or the like. Semiconductor chip 13 has a thickness of about 50 μm, for instance. Bumps 19 that are surface electrodes are formed on first side 11 of semiconductor chip 13, and bumps 26 that are back electrodes are formed on second side 12 of semiconductor chip 13. Surface electrode 19 and back electrode 26 corresponding thereto are electrically connected to each other by a conductor, i.e., a through-hole interconnection that penetrates through semiconductor chip 13.

Semiconductor chip 13 is sucked through vacuum holes 52 provided in vacuum chuck stage 50 by a vacuum device, not shown, and semiconductor chip 13 is held on vacuum chuck stage 50. The side walls of recess 51 are slopes 53, and recess 51 is formed in a tapered shape that becomes gradually thinner toward the bottom. Consequently, the position of semiconductor chip 13 held on vacuum chuck stage 50 is accurately adjusted. Contacting slopes 53 with the end parts of semiconductor chip 13 allows semiconductor chip 13 to be perfectly sucked and held on stage 50.

Preferably, vacuum chuck stage 50 has a heating mechanism, not shown, e.g., a heater. It is possible that the heating mechanism heats semiconductor chip 13 held on vacuum chuck stage 50 at a predetermined temperature of about 100° C., for example.

Figure 6B:
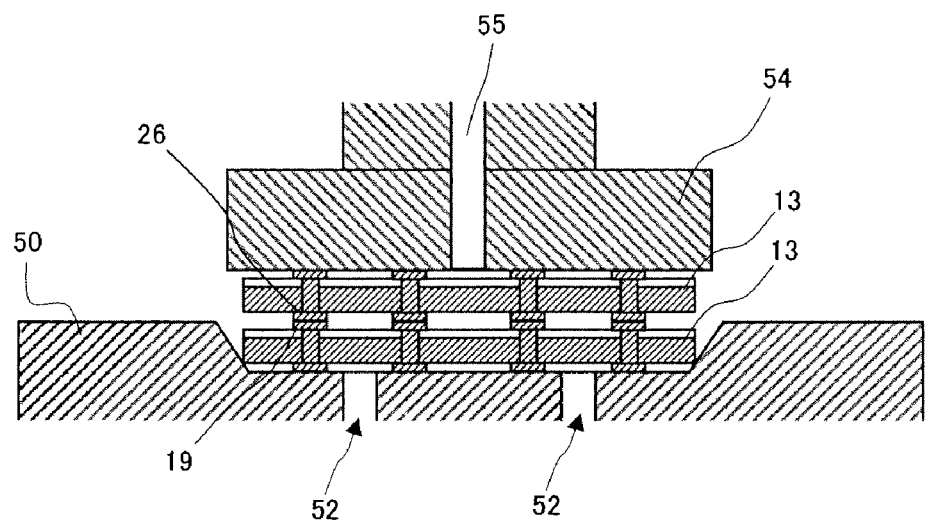

Subsequently, as shown in FIG. 6B, semiconductor chip 13 in a second stage is placed on semiconductor chip 13 in a first stage, which is held on vacuum chuck stage 50. Semiconductor chip 13 in the second stage is similarly formed as semiconductor chip 13 in the first stage. At this time, bonding tool 54 having a heater applies a load to semiconductor chip 13 in the second stage while being heated at a high temperature of about 300° C., for example. In this manner, surface electrodes 19 formed on first side 11 of semiconductor chip 13 in the first stage are electrically connected to back electrodes 26 formed on second side 12 of semiconductor chip 13 in the second stage by thermocompression bonding. It is possible that ultrasonic waves are further applied to the joining parts in joining semiconductor chip 13 in the second stage to semiconductor chip 13 in the first stage.

Preferably, bonding tool 54 is provided with vacuum hole 55 such that bonding tool 54 can hold semiconductor chip 13 in the second stage.

Figure 6C:
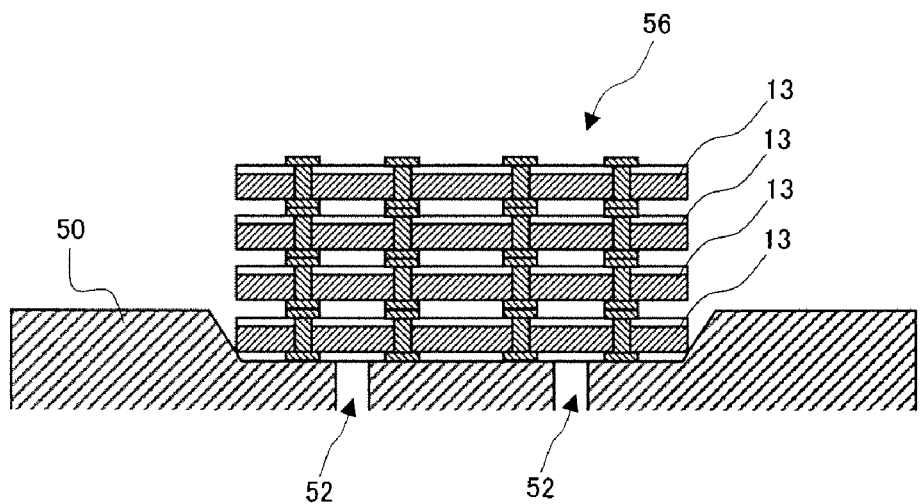

Similarly, semiconductor chips 13 in third and fourth stages are mounted on semiconductor chip 13 in the second stage (see FIG. 6C). It is possible that semiconductor chips 13 in the third and fourth stages also have configurations similar to the configuration of the semiconductor chip 13 in the first stage. As described above, chip stack 56 is formed in which four semiconductor chips 13 are laminated. It is possible that the number of semiconductor chips 13 forming the chip stack is two or more.

Until chip stack 56 is formed, semiconductor chips 13 are sucked and held by sucking semiconductor chips 13 through vacuum holes 52 provided in vacuum chuck stage 50.

Figure 7A:
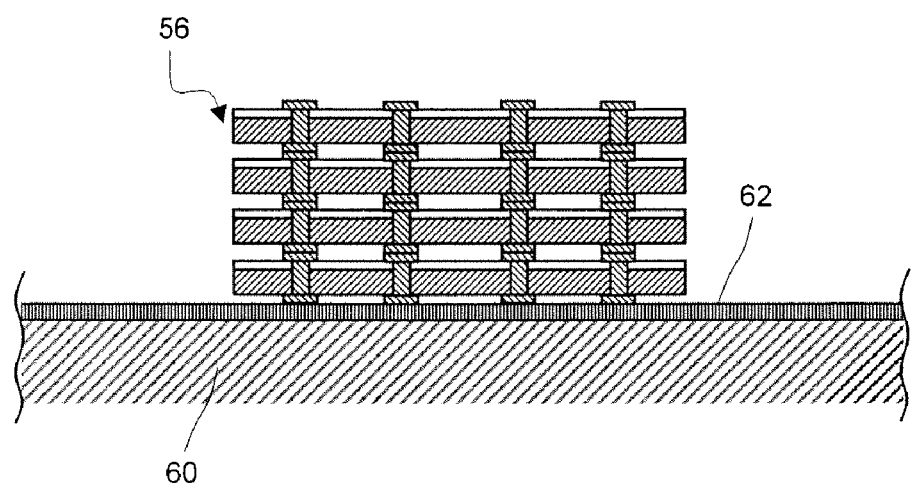
FIGS. 7A to 7C are process drawings depicting the processes of fabricating the semiconductor device, subsequent to the processes shown in FIGS. 6A to 6C.

Subsequently, as shown in FIG. 7A, chip stack 56 is placed on coating sheet 62 that is bonded to another stage 60 (hereinafter, referred to as a coating stage). Preferably, for coating sheet 62, a material having poor wettability with an under-fill material that reinforces the joining of chips to each other is used. For this coating sheet 62, a fluorine sheet, a sheet applied with a silicon adhesive, or the like is used, for example.

In addition, it is possible that coating sheet 62 is bonded to a ring-shaped jig, chip stack 56 is placed on coating sheet 62 and then an under-fill material, described later, is supplied on coating stage 60.

Figure 7B:
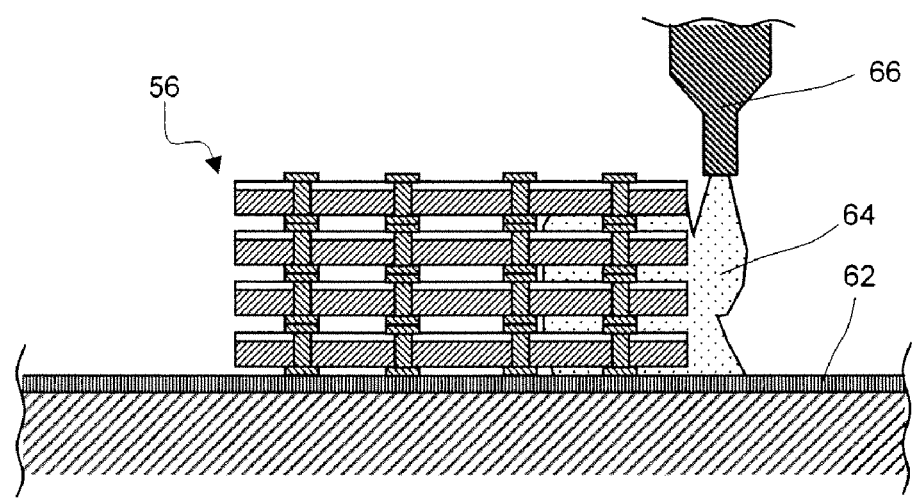

As shown in FIG. 7B, under-fill material 64 is supplied near the end part of chip stack 56 on coating sheet 62. Under-fill material 64 is filled in the space between laminated semiconductor chips 13 by capillarity. Under-fill material 64 is supplied from dispenser 66, for example.

In the case in which coating sheet 62 is made of a material having poor wettability with under-fill material 64, such an advantage is provided in which the spread of under-fill material 64 is suppressed on coating sheet 62 to reduce the fillet width. In addition, the use of coating sheet 62 prevents under-fill material 64 from being attached to coating stage 60.

Figure 7C:
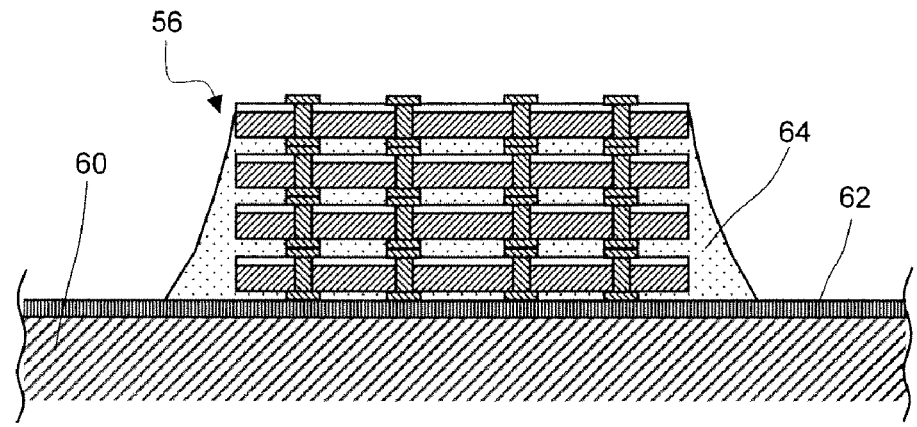

After the completion of filling under-fill material 64, chip stack 56 is cured together with coating sheet 62 at a predetermined temperature of about 150° C., for example. Consequently, under-fill material 64 is hardened. In this manner, as shown in FIG. 7C, under-fill material 64 is formed around chip stack 56 and between semiconductor chips 13.

After hardening under-fill material 64, chip stack 56 is picked up from coating sheet 62, and chip stack 56 is stored in a storage tray, not shown. In the case in which coating sheet 62 is a material having poor wettability with under-fill material 64, it is made possible to readily pick up chip stack 56.

Subsequently, wiring board 70 for mounting chip stack 56 is prepared (see FIG. 8A). It is possible that wiring board 70 is a glass epoxy wiring board having a thickness of 0.14 mm, for example. Wiring board 70 has a plurality of product forming parts 71 arranged in a matrix. Each of a plurality of product forming parts 71 is formed with a predetermined wiring pattern, and the wiring pattern is partially covered with an insulating film, e.g., a solder resist. In addition, dicing lines 72 are each formed between product forming parts 71 of wiring board 70.

Portions at which the wiring patterns on one side of product forming part 71 are exposed from the solder resist are connection pads 73. Furthermore, portions at which wires on the other side of product forming part 71 are exposed from the solder resist are lands 74. Connection pads 73 are electrically connected to corresponding lands 74 with interconnections formed in wiring board 70.

Wire bumps 75 in a projected shape are formed on connection pads 73 of wiring board 70. Wire bumps 75 are made of gold (Au) or copper (Cu), for example. A wire bonding device, not shown, melts the tip end of a wire, and compresses the wire formed with a ball on the tip end onto connection pad 73 of wiring board 70 by thermo-sonic bonding. After that, the rear end of the wire is drawn and cut to form wire bump 75.

Because wire bump 75 is in a projected shape, the connecting part between wire bump 75 and the electrode of semiconductor chip 13 has an area smaller than the area of the connecting part between wire bump 75 and wiring board 70. Consequently, the size and pitch of through-hole interconnections 18 in semiconductor chip 13 can be reduced.

In the foregoing example, wire bumps 75 are formed on connection pads 73 of wiring board 70 in order to facilitate the connection of chip stack 56 to wiring board 70. However, it is possible to directly connect electrodes 79 of chip stack 56 and connection pads 73 of wiring board 70 to each other. Here, electrode 79 of chip stack 56 corresponds to any one of surface electrode 19 and back electrode 26 of semiconductor chips 13 forming chip stack 56 (also see FIG. 6A).

Figure 8A:
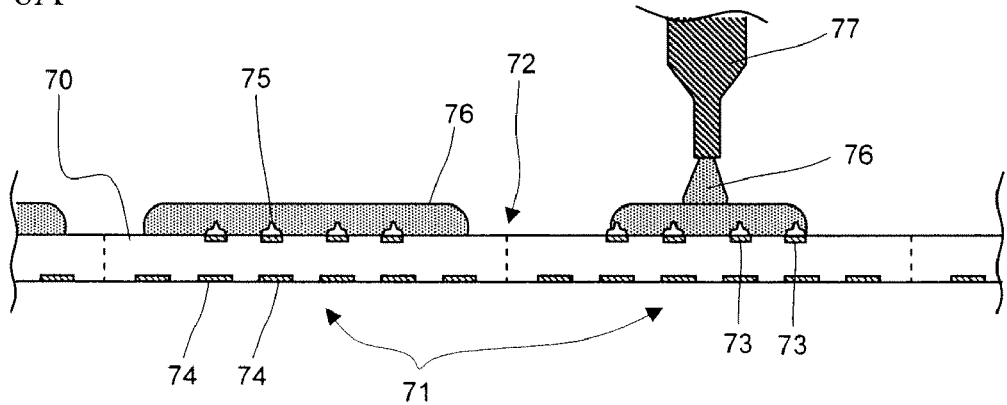
FIGS. 8A to 8C are process drawings depicting the processes of fabricating the semiconductor device, subsequent to the processes shown in FIGS. 7A to 7C.

Subsequently, as shown in FIG. 8A, insulating adhesive member 76 is applied over product forming parts 71 of wiring board 70. It is possible to apply adhesive member 76 in such a way that a non conductive paste (NCP), for example, is applied with dispenser 77.

Figure 8B:
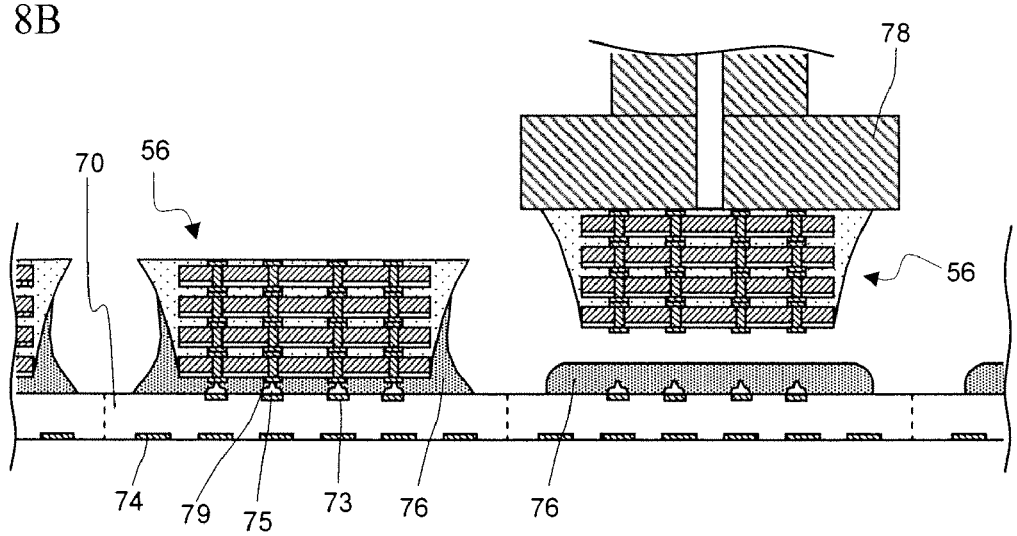

Subsequently, as shown in FIG. 8B, chip stack 56 is mounted on each of product forming parts 71 of wiring board 70. For mounting chip stack 56, it is possible to use bonding tool 78 having a heating mechanism, for example, not shown. Bonding tool 78 sucks and holds one side of chip stack 56, and heats chip stack 56 to a predetermined temperature with the heating mechanism.

Figure 8C:
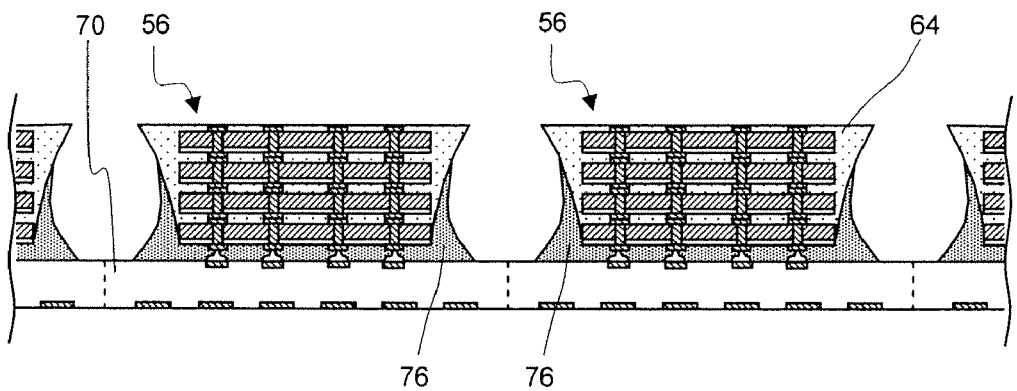

Bonding tool 78 thermally compresses electrode bumps exposed on the front side of chip stack 56 onto corresponding connection pads 73 of wiring board 70 at a predetermined temperature of about 300° C., for example. At this time, adhesive member 76 on wiring board 70 is spread and filled into between chip stack 56 and wiring board 70. In this manner, as shown in FIG. 8C, chip stack 56 is mounted on each product forming part 71 of wiring board 70.

Preferably, under-fill material 64 around chip stack 56 is in a tapered shape. This is because adhesive member 76 is prevented from rising when mounting chip stack 56 on wiring board 70. Therefore, cracking or faulty joining of chip stack 56 is reduced, which is caused by attaching adhesive member 76 to bonding tool 78.

Figure 9A:
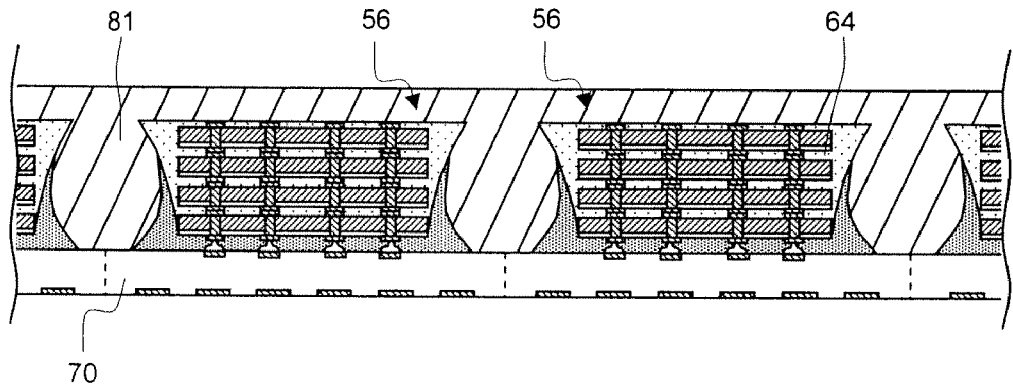
FIGS. 9A to 9C are process drawings depicting the processes of fabricating the semiconductor device, subsequent to the processes shown in FIGS. 8A to 8C.

Subsequently, as shown in FIG. 9A, chip stacks 56 mounted on wiring board 70 are encapsulated (molding process). In the molding process, wiring board 70 is placed on a molding die having upper and lower dies of a transfer molding device, not shown. The molding die is formed with a cavity that collectively covers a plurality of chip stacks 56, and chip stacks 56 on wiring board 70 are placed in this cavity.

Encapsulation material 81 that is heated and melted is then filled from a gate disposed on the molding die into the cavity for encapsulating chip stacks 56 on wiring board 70. For encapsulation material 81, a thermosetting resin such as an epoxy resin is used.

Encapsulation material 81 is cured at a predetermined temperature of about 180° C., for example, and then thermoset, while encapsulation material 81 is being supplied to one side of wiring board 70. In this manner, encapsulation material 81 is formed, which collectively covers the plurality of chip stacks 56 on wiring board 70. After that, the molding die surrounded around encapsulation material 81 bakes encapsulation material 81 at a predetermined temperature to completely harden encapsulation material 81.

Because under-fill material 64 is filled in advance between individual semiconductor chips 13 forming chip stack 56, no void is produced between semiconductor chips 13 in this molding process.

Figure 9B:
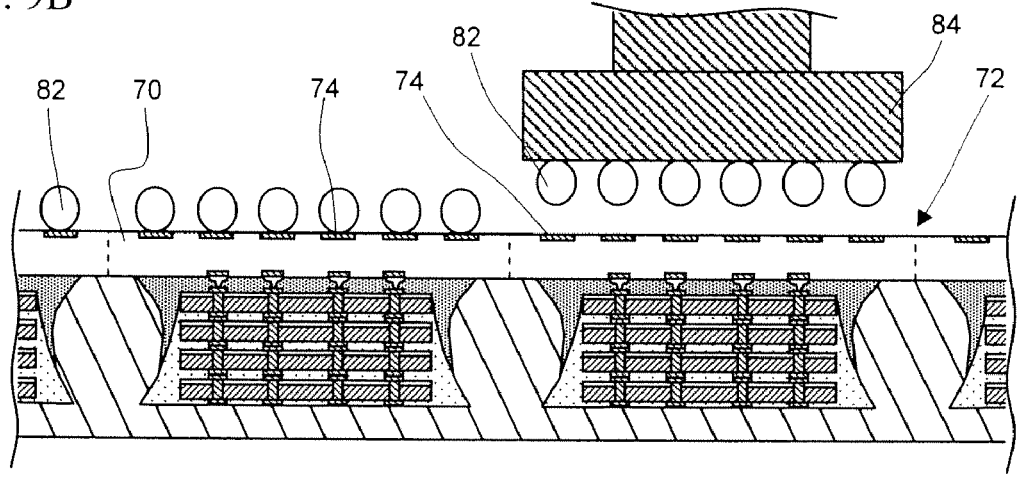

Subsequently, as shown in FIG. 9B, external terminals 82 are formed on lands 74 formed on wiring board 70. For external terminals 82, conductive metal balls like solder are used. The metal balls are put on lands 74 on wiring board 70 by mount tool 84, for example, having a sucking hole to suck and hold a plurality of the metal balls.

More specifically, a flux is transferred to a plurality of the metal balls held by mount tool 84, and the metal balls are collectively put on a plurality of lands 74 on wiring board 70. After putting the metal balls on all the product forming parts 71, wiring board 70 is reflowed to form external terminals 82.

Figure 9C:
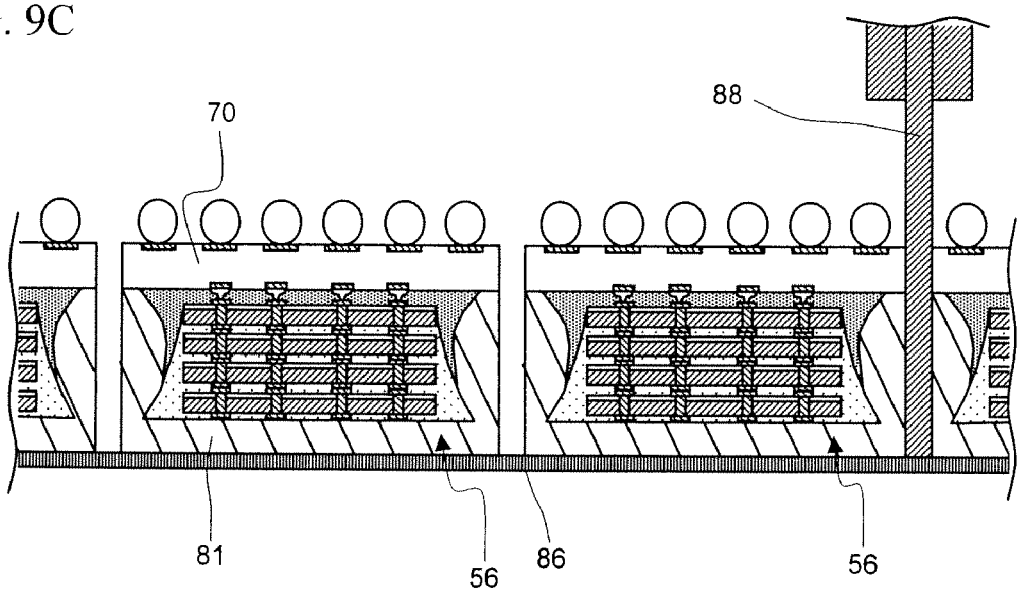

Subsequently, as shown in FIG. 9C, wiring board 70 formed with external terminals 82 is diced into each separate product forming part 71 along dicing lines 72 (substrate dicing process). In the substrate dicing process, first, dicing tape 86 is applied to one side of encapsulation materials 81 formed on wiring board 70, and wiring board 70 is supported by dicing tape 86.

Subsequently, wiring board 70 is cut lengthwise and crosswise along dicing lines 72 with dicing blade 88 of a dicing device, not shown. In this manner, wiring board 70 is diced into individual product forming parts 71. Product forming parts 71 each mounted with chip stack 56 are then picked up from dicing tape 86, so that it is possible to fabricate a plurality of COC semiconductor devices.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A method of fabricating a semiconductor device, comprising:
   preparing a wafer having a plurality of chip areas, each chip area to become a semiconductor chip;
   bonding a first side of said wafer to a support substrate through a removable adhesive;
   dividing said wafer into individually separate semiconductor chips;
   applying adhesive tape to a second side of said separate semiconductor chips, said second side being opposite to said first side bonded to said support substrate, and said adhesive tape being softer than said support substrate;
   removing said support substrate from said semiconductor chips; and
   picking up said separate semiconductor chips on said adhesive tape,
   wherein said removable adhesive is formed of a first adhesive layer covering said first side of said wafer and a second adhesive layer that comes into contact with said support substrate, and
   wherein said support substrate is removed from said semiconductor chips while energy is being applied to said second adhesive layer.

2. The method of fabricating a semiconductor device according to claim 1,
   wherein the adhesion force of said second adhesive layer is weakened by applying specific energy, and
   wherein said support substrate is removed from said semiconductor chips while said specific energy is being applied to said second adhesive layer.

3. The method of fabricating a semiconductor device according to claim 2, further comprising bringing a third adhesive into contact with said first adhesive layer on said first side of said semiconductor chip to transfer said first adhesive layer to said third adhesive after removing said support substrate from said semiconductor chip, said third adhesive having adhesion force to said first adhesive layer greater than adhesion force between said semiconductor chip and said first adhesive layer.

4. The method of fabricating a semiconductor device according to claim 1,
   wherein said second adhesive layer is vaporized by applying laser light, and
   wherein said support substrate is removed from said semiconductor chips by applying laser light to said second adhesive layer to vaporize said second adhesive layer.

5. The method of fabricating a semiconductor device according to claim 1,
   wherein said wafer is formed with a dicing line to be a boundary between a plurality of said chip areas,
   wherein said support substrate is a transparent substrate, and
   wherein said wafer is divided into individually separate semiconductor chips by cutting said wafer along said dicing line while said dicing line formed on said wafer is being detected through said support substrate.

6. The method of fabricating a semiconductor device according to claim 5,
   wherein said wafer is cut such that a groove which has the depth from said second side of said wafer to said removal adhesive is formed.

7. The method of fabricating a semiconductor device according to claim 1,
   wherein said semiconductor chip on said adhesive tape is picked up with a vacuum collet configured to suck said semiconductor chip while said semiconductor chip is being plunged up from a side of said adhesive tape, the side being opposite to a side of said adhesive tape having said semiconductor chips bonded thereon.

8. The method of fabricating a semiconductor device according to claim 1, wherein the first adhesive layer is larger in thickness than the second adhesive layer.

9. A method of fabricating a semiconductor device, comprising:
preparing a wafer having a plurality of chip areas, each chip area to become a semiconductor chip;
forming a predetermined circuit and a plurality of surface electrodes on a first side of said wafer in each of the plurality of said chip areas;
bonding said first side of said wafer to a support substrate through a removable adhesive;
forming a conductor and a back electrode, from a second side of said wafer, said conductor being penetrated through said wafer and electrically connected to said surface electrode, said back electrode being electrically connected to said conductor, and said second side being opposite to said first side;
dividing said wafer into individually separate semiconductor chips;
applying adhesive tape to said second side of said separate semiconductor chips, said second side being opposite to said first side bonded to said support substrate, and said adhesive tape being softer than said support substrate;
removing said support substrate from said semiconductor chips; and
picking up said separate semiconductor chips that are on said adhesive tape.

10. The method of fabricating a semiconductor device according to claim 9, further comprising:
grinding the wafer before the forming the conductor and the back electrode.

11. The method of fabricating a semiconductor device according to claim 9, wherein the removable adhesive is weakened in adhesive force by applying specific energy thereto, and
wherein the support substrate is removed from the wafer after the specific energy is applied to the removable adhesive.

12. The method of fabricating a semiconductor device according to claim 9, wherein each of the chip areas are defined by dicing lines,
wherein the support substrate is a transparent substrate, and
wherein the wafer is divided into individually separate semiconductor chips by cutting the wafer along the dicing lines that are recognized through the transparent substrate.

13. The method of fabricating a semiconductor device according to claim 9, wherein the semiconductor chip on the adhesive tape is picked up with a vacuum collet configured to suck the semiconductor chip while the semiconductor chip is plunged up from the tape.

14. A method of manufacturing a semiconductor device, comprising:
preparing a semiconductor wafer including a plurality of semiconductor chips therein, the semiconductor chips being defined by dicing lines, each of the semiconductor chips including a plurality of upper electrodes on side of a first surface of the semiconductor wafer;
bonding the first surface of the semiconductor wafer to a support substrate;
forming a plurality of lower electrodes on a second surface of the semiconductor wafer that is opposite to the first surface, each of the lower electrodes being electrically connected to the upper electrodes;
dicing the semiconductor wafer along the dicing lines to separate the semiconductor chips from one another;
applying a tape on the second surface of the semiconductor wafer after the dicing;
removing the support substrate from the semiconductor wafer applied with the tape; and
picking up the semiconductor chips from the tape.

15. The method of manufacturing a semiconductor device according to claim 14, further comprising:
grinding the semiconductor wafer before the forming the plurality of lower electrodes.

16. The method of manufacturing a semiconductor device according to claim 14, further comprising:
forming a plurality of through-hole electrodes in the semiconductor wafer before the forming the lower electrodes,
wherein the upper electrodes are electrically connected to the lower electrodes through the through-hole electrodes.

17. The method of manufacturing a semiconductor device according to claim 14, wherein the semiconductor wafer is bonded to the support substrate through an adhesive, the adhesive being weakened in adhesive force by applying specific energy thereto, and
wherein the support substrate is removed from the semiconductor wafer after the specific energy is applied to the adhesive.

18. The method of manufacturing a semiconductor device according to claim 14, wherein the support substrate is a transparent substrate, and
wherein the semiconductor wafer is diced along the dicing lines that are recognized through the transparent substrate.

19. The method of manufacturing a semiconductor device according to claim 14, wherein the semiconductor chip on the tape is picked up with a vacuum collet configured to suck the semiconductor chip while the semiconductor chip is plunged up from the tape.

20. The method of manufacturing a semiconductor device according to claim 14, wherein the semiconductor wafer is bonded to the support substrate through an adhesive,
wherein the adhesive is formed of a first adhesive layer covering the first surface of the semiconductor wafer and a second adhesive layer that comes into contact with the support substrate, and
wherein the support substrate is removed from the semiconductor wafer while energy is being applied to the second adhesive layer.

* * * * *